(12) United States Patent
Shibib et al.

(10) Patent No.: US 7,148,540 B2
(45) Date of Patent: Dec. 12, 2006

(54) GRADED CONDUCTIVE STRUCTURE FOR USE IN A METAL-OXIDE-SEMICONDUCTOR DEVICE

(75) Inventors: Muhammed Ayman Shibib, Wyomissing, PA (US); Shuming Xu, Schnecksville, PA (US)

(73) Assignee: Agere Systems Inc., Allentown, PA (US)

(*) Notice: Subject to any disclaimer, the term of this patent is extended or adjusted under 35 U.S.C. 154(b) by 21 days.

(21) Appl. No.: 10/878,857

(22) Filed: Jun. 28, 2004

(65) Prior Publication Data

US 2005/0285189 A1  Dec. 29, 2005

(51) Int. Cl.
*H01L 23/58* (2006.01)
(52) U.S. Cl. .................. 257/336; 257/341; 257/344; 257/408; 257/409; 257/488
(58) Field of Classification Search ............... 257/335, 257/288, 296–304, 336, 341, 344, 408, 409
See application file for complete search history.

(56) References Cited

U.S. PATENT DOCUMENTS 5,907,173 A * 5/1999 Kwon et al. ............... 257/336
5,912,490 A * 6/1999 Hebert et al. ............... 257/340
6,215,152 B1 * 4/2001 Hebert ......................... 257/340

OTHER PUBLICATIONS

P.C.A. Hammes et al., "High efficiency, High Power WCDMA LDMOS Transistors for Base Stations," Microwave Journal, Horizon House Publications, 4 pages, Apr. 2004.*
P.C.A. Hammes et al., "High Efficiency, High Power WCDMA LDMOS Transistors for Base Stations," Microwave Journal, Horizon House Publications, 4 pages, Apr. 2004.

* cited by examiner

*Primary Examiner*—Zandra V. Smith
*Assistant Examiner*—Tsz Chiu (57) ABSTRACT

An MOS device comprises a semiconductor layer of a first conductivity type and source and drain regions of a second conductivity type formed in the semiconductor layer, the source and drain regions being spaced apart from one another. A drift region is formed in the semiconductor layer proximate an upper surface of the semiconductor layer and between the source and drain regions, and a insulating layer is formed on the semiconductor layer above at least a portion of the drift region. A gate is formed on the insulating layer and at least partially between the source and drift regions. The MOS device further includes a conductive structure comprising a first end formed on the insulating layer and spaced apart from the gate, and a second end formed on the insulating layer and extending laterally toward the drain region above at least a portion of the drift region. The conductive structure is configured such that a thickness of the insulating layer under the second end of the conductive structure increases as the second end extends toward the drain region.

25 Claims, 7 Drawing Sheets

GRADED CONDUCTIVE STRUCTURE FOR USE IN A METAL-OXIDE-SEMICONDUCTOR DEVICE

FIELD OF THE INVENTION

The present invention relates generally to semiconductor devices, and more particularly relates to techniques for improving high-frequency performance in a metal-oxide-semiconductor (MOS) device.

BACKGROUND OF THE INVENTION

Power MOS devices, including laterally diffused metal-oxide-semiconductor (LDMOS) devices, are employed in a variety of applications, such as, for example, power amplifiers in wireless communications systems. In applications where high-frequency operation is desired, such as in a radio frequency (RF) range (e.g., above about 1 gigahertz (GHz)), a conventional LDMOS device may employ a field plate structure, often referred to as a "dummy gate," adjacent to the traditional gate in order to reduce Miller capacitance between the gate and a drain region of the device, and to reduce hot-carrier injection (HCI) degradation in the device.

HCI degradation in an MOS device generally results from heating and subsequent injection of carriers into the gate oxide of the device, which results in a localized and non-uniform buildup of interface states and oxide charges near and underneath a gate of the device. This phenomenon can produce variations in certain characteristics of the MOS device, including threshold voltage, transconductance, drain current, etc., thus undesirably affecting the operation and reliability of the device. It is well known that HCI degradation is a strong function of the internal electric field distributions at the interface of the MOS device.

The effectiveness of the dummy gate, which may be measured by, for example, a reduction in Miller capacitance and/or HCI degradation associated with the LDMOS device, can be improved by reducing a thickness of the dielectric layer (gate dielectric) underneath the dummy gate. However, reducing the gate dielectric thickness increases the gate-to-source capacitance Cgs (i.e., input capacitance) of the device, thereby undesirably affecting the high-frequency performance. The increase in the input capacitance of the device resulting from the reduction in gate dielectric thickness often significantly undermines any beneficial reduction in the Miller capacitance provided by the dummy gate. Moreover, reducing the gate dielectric thickness undesirably reduces a breakdown voltage of the device.

In a conventional LDMOS device, which typically includes a lightly-doped drain (LDD) region, the LDD region is often formed at or near an upper surface interface between the silicon and oxide of the device. Locating the LDD region in close relative proximity to the silicon/oxide interface, however, significantly increases the likelihood that ionized carriers will become trapped at the interface, thereby increasing HCI degradation in the device.

In many applications, such as, for example, power applications, it is desirable to minimize the on-resistance, $R_{ON}$, associated with the MOS device. In an LDMOS device, since the on-resistance is dominated primarily by the characteristics of the LDD region, one known methodology for reducing the on-resistance is to increase the doping concentration of the LDD region. However, since the LDD region is typically formed at the silicon/oxide interface of the device, increasing the doping concentration of the LDD region also undesirably increases HCI degradation in the device.

Other attempts at reducing the on-resistance of the MOS device have included increasing the junction depth of the LDD region. However, since the gate-to-drain capacitance, Cgd, of the device is generally proportional to the junction depth of the LDD region, as the depth of the LDD region increases the gate-to-drain capacitance also increases, thereby undesirably affecting the high-frequency performance of the device. Thus, prior attempts to improve the high-frequency performance of the MOS device have primarily involved a trade-off among gate-to-drain capacitance, gate-to-source capacitance, on-resistance, breakdown voltage and HCI degradation in the device.

There exists a need, therefore, for an MOS device capable of improved high-frequency performance, that does not suffer from one or more of the problems exhibited by conventional MOS devices. Moreover, it would be desirable if the improved MOS device were compatible with existing integrated circuit (IC) fabrication process technologies.

SUMMARY OF THE INVENTION

The present invention meets the above-noted need by providing techniques for improving high-frequency performance of an MOS device without significantly reducing breakdown voltage and/or increasing HCI degradation in the device. Moreover, the techniques of the present invention can be used to fabricate an integrated circuit including, for example, an LDMOS device, using conventional MOS compatible process technology. Consequently, the cost of manufacturing the integrated circuit is not significantly increased.

In accordance with one aspect of the invention, an MOS device is formed comprising a semiconductor layer of a first conductivity type and source and drain regions of a second conductivity type formed in the semiconductor layer, the source and drain regions being spaced apart from one another. A drift region is formed in the semiconductor layer proximate an upper surface of the semiconductor layer and between the source and drain regions, and an insulating layer is formed on the semiconductor layer above at least a portion of the drift region. A gate is formed on the insulating layer and at least partially between the source and drift regions. The MOS device further includes a conductive structure comprising a first end formed on the insulating layer and spaced apart from the gate, and a second end formed on the insulating layer and extending laterally toward the drain region above at least a portion of the drift region. The conductive structure is configured such that a thickness of the insulating layer under the second end of the conductive structure increases as the second end extends toward the drain region. In this manner, the MOS device exhibits improved high-frequency performance and is also substantially compatible with a CMOS process technology.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative CMOS integrated circuit fabrication technology suitable for forming discrete RF LDMOS transistors, as well as circuits or other devices. It should be appreciated, however, that the present invention is not limited to the fabrication of this or any particular circuit or other device. Rather, the invention is more generally applicable to an MOS device comprising a novel conductive structure which advantageously enables the MOS device to provide improved high-frequency performance without significantly impacting breakdown voltage and/or HCI degradation in the device. Moreover, the conductive structure is fully compatible with a CMOS process technology.

Although implementations of the present invention are described herein with specific reference to an LDMOS device and a vertical diffused MOS (DMOS) device, it is to be appreciated that the techniques of the present invention are similarly applicable to other devices, such as, but not limited to, an extended drain MOS device, as will be understood by those skilled in the art. Furthermore, although the invention will be described herein in the context of a p-channel MOS device, it is to be understood by those skilled in the art that an n-channel MOS device could similarly be formed by substituting opposite polarities to those given for the p-channel embodiment, in at least the active regions of the device, and that the techniques and advantages of the present invention will also apply to the alternative embodiment.

It is to be understood that the various layers and/or regions shown in the accompanying figures may not be drawn to scale. Furthermore, one or more semiconductor layers of a type commonly used in such integrated circuit structures may not be explicitly shown in a given figure for ease of explanation. This does not imply that the semiconductor layers not explicitly shown are omitted in the actual integrated circuit device.

Figure 1:
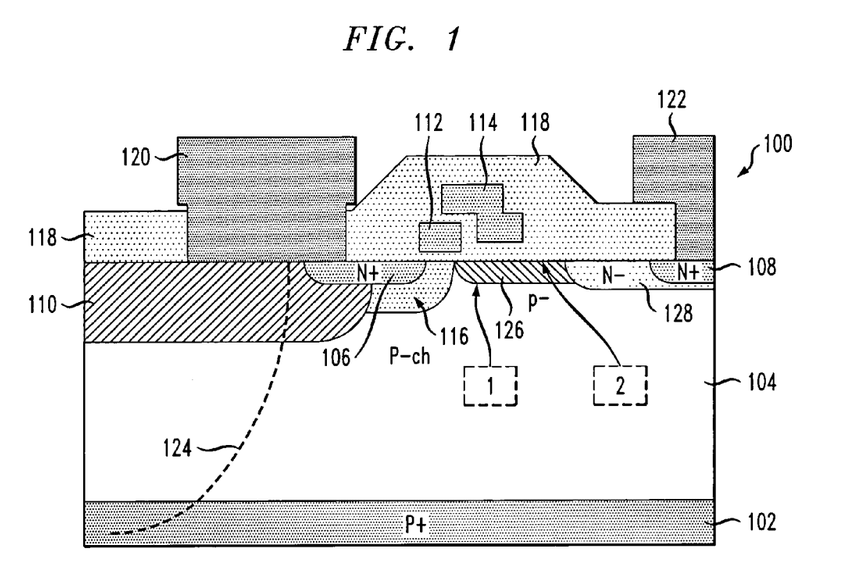
FIG. 1 is a cross-sectional view illustrating at least a portion of a semiconductor wafer including an LDMOS device in which the techniques of the present invention can be implemented.

FIG. 1 illustrates a cross-sectional view of at least a portion of a semiconductor wafer in which the techniques of the present invention may be implemented. The semiconductor wafer includes an LDMOS device 100 formed on a substrate 102. The LDMOS device 100 includes a source region 106 and a drain region 108 formed in an epitaxial region 104 of the semiconductor wafer 100. The LDMOS device 100 further includes a gate 112 formed above a channel region 116 of the device. The channel region 116 is at least partially formed between the source and drain regions. A drift region is generally formed in the epitaxial layer 104 of the LDMOS device, which may comprise a first LDD region 126 and a second LDD region 128 formed between the channel region 116 and drain region 108.

The LDMOS device 100 also includes a drain terminal 122, electrically connected to the drain region 108, and a source terminal 120, electrically connected to the source region 106. An enhancement region 110 associated with the source region 106 may be formed adjacent to and at least partially below the source region. One or more trench sinkers 124 may be formed through the epitaxial layer 104 for providing an electrical connection between the source region 106 and the substrate 102. An oxide layer 118 is generally formed on an upper surface of the integrated circuit 100 to electrically isolate the source, drain and gate terminals of the device as well as to protect the device.

Due at least in part to the relatively high electric field concentration near the edges of the gate 112 and the close relative proximity of the gate to an interface between an upper surface of the silicon epitaxial layer 104 and the oxide layer 118, HCI often occurs at the silicon/oxide interface near the first LDD region 126 immediately proximate the edge of the gate 112, such as in region 1. In order to reduce HCI degradation in the LDMOS device, a dummy gate 114 may be added to the device. The dummy gate 114 is conventionally formed such that at least a portion of the dummy gate overlaps the gate 112 as shown. The oxide layer 118 formed on an upper surface of the integrated circuit electrically isolates the gate 112 from the dummy gate 114.

Although the dummy gate 114 may reduce the gate-to-drain capacitance Cgd and improve HCI degradation in the first LDD region of the device, it also undesirably introduces additional gate capacitance. Since both the gate-to-dummy gate spacing and the dummy gate-to-LDD region spacing is determined primarily by the same gate oxide process, this additional capacitance cannot be readily reduced using conventional methodologies. Furthermore, while the dummy gate 114 may help reduce HCI degradation at a silicon/oxide interface between the oxide layer 118 and the upper surface of the epitaxial layer 104, HCI degradation will generally increase at the silicon/oxide interface near the first LDD region 126 immediately proximate an edge of the dummy gate 114, such as in region 2 of the device. HCI degradation can be further reduced by lowering the doping concentration of at least the first LDD region 126 and/or reducing a size of the drift region. However, this will undesirably result in an increase in the on-resistance associated with the device, as previously stated. Thus, in the LDMOS structure shown in FIG. 1, there is often a trade-off that exists between on-resistance and HCI effects in the device. Furthermore, improving HCI degradation and/or reducing the drift region may lower the breakdown voltage of the device, which is undesirable.

In many applications, for example, power applications and applications in which high-frequency operation is desired, such as in an RF range (e.g., above about 1GHz), it is desirable to minimize the on-resistance, $R_{DS}$, associated with the MOS device. In an LDMOS device, since the on-resistance is dominated primarily by the characteristics of the LDD region, one known methodology for reducing the on-resistance is to increase the doping concentration of the LDD region. However, increasing the doping concentration of the LDD region also undesirably reduces the breakdown voltage of the device and increases HCI degradation in the device. Therefore, in accordance with an illustrative embodiment of the invention, in order to enable the on-resistance of the LDMOS device to be reduced without significantly reducing the breakdown voltage and/or increasing HCI degradation in the device, a uniquely shaped gate conductive structure is provided, which will be described in further detail below.

Figure 2:
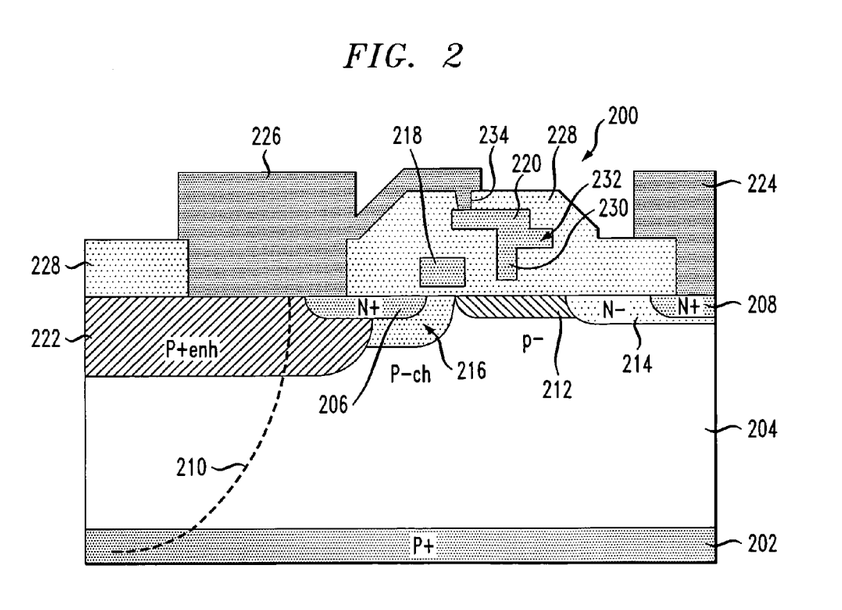
FIG. 2 is a cross-sectional view depicting at least a portion of a semiconductor wafer including an exemplary LDMOS device in which the techniques of the present invention are implemented.

FIG. 2 illustrates a cross-sectional view of at least a portion of a semiconductor wafer comprising an LDMOS device 200 in which the techniques of the present invention are implemented. The LDMOS device 200 includes a semiconductor substrate 202. The substrate 202 is commonly formed of single-crystal silicon (e.g., having a <100> or <111> crystal orientation), although suitable alternative materials may also be used, such as, but not limited to, germanium (Ge), gallium arsenide (GaAs), etc. Additionally, the substrate is preferably modified by adding an impurity or dopant to change the conductivity of the material (e.g., n-type or p-type). In a preferred embodiment of the invention, the substrate 202 is of p-type conductivity and may thus be referred to as a p+ substrate. A p+ substrate may be formed by adding a p-type impurity or dopant (e.g., boron) of a desired concentration (e.g., about $5\times10^{18}$ to about $5\times10^{19}$ atoms per cubic centimeter) to the substrate material, such as by a diffusion or implant step, to change the conductivity of the material as desired.

An epitaxial layer 204 is preferably formed on at least a portion of the substrate 202. By introducing selected types of impurities (e.g., boron, phosphorous, arsenic, etc.) into the epitaxial layer 204, a resistivity of the epitaxial layer can be modified as desired. The thickness of the epitaxial layer is typically about 6 to 10 micrometers, although the present invention is not limited to any particular thickness of the epitaxial layer. In a preferred embodiment of the invention, the epitaxial layer 204 is doped with a p-type impurity (e.g., boron). The doping concentration of the epitaxial layer 204 is preferably lower (e.g., about $10^{15}$ to about $10^{16}$ atoms per cubic centimeter) in comparison to the doping concentration of the substrate 202, and may therefore be referred to as a p− epitaxial layer.

The term "semiconductor layer" as may be used herein refers to any semiconductor material upon which and/or in which other materials may be formed. The semiconductor layer may comprise a single layer, such as, for example, substrate 202, or it may comprise multiple layers, such as, for example, the substrate and epitaxial layer 204. The semiconductor wafer comprises the substrate 202, with or without the epitaxial layer 204, and preferably includes one or more other semiconductor layers formed on the substrate. The term "wafer" is often used interchangeably with the term "silicon body," since silicon is typically employed as the semiconductor material comprising the wafer. It should be appreciated that although the present invention is illustrated herein using a portion of a semiconductor wafer, the term "wafer" may include a multiple-die wafer, a single-die wafer, or any other arrangement of semiconductor material on which a semiconductor structure may be formed.

The exemplary LDMOS device 200 further includes a source region 206 and a drain region 208 formed in the epitaxial layer 204, proximate an upper surface of the epitaxial layer, such as by a conventional implant and diffusion process. The source and drain regions are preferably doped, such as by a conventional implant step, with an impurity of a known concentration level to selectively change the conductivity of the material as desired. Preferably, the source and drain regions 206, 208 have a conductivity type associated therewith which is opposite a conductivity type of the substrate 202, so that active regions can be formed in the device. In a preferred embodiment of the invention, the source and drain regions 206, 208 are of n-type conductivity.

The LDMOS device 200 preferably includes a drain terminal 224, electrically connected to the drain region 208, and a source terminal 226, electrically connected to the source region 206. An enhancement region 222 associated with the source region 206 may be formed adjacent to and at least partially below the source region. Electrical connection between the source region 206 and the substrate 202 may be provided by forming one or more trench sinkers 210 through the epitaxial layer 204. The trench sinker 210 may be formed in a conventional manner, such as, for example, by opening windows in the epitaxial layer 204 (e.g., by photolithographic patterning and etching) to expose the substrate 202, and filling the trenches 210 with a conductive material, as will be understood by those skilled in the art. In a preferred embodiment of the invention, the trench sinkers 210 are of p-type conductivity. An insulating layer 228 is generally formed on at least a portion of the upper surface of the epitaxial layer 204 to electrically isolate the source and drain terminals of the device as well as to protect the device.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

A channel region 216 and a drift region, which may comprise a first LDD region 212 and a second LDD region 214, are formed in LDMOS device 200. Although shown as comprising two regions, it is to be appreciated that the drift region may comprise a single region or more than two regions. The channel region 216 is formed proximate the source region 206, while the drift region extends between the channel region 216 and the drain region 208. The channel region 216 may be formed of a material having the same conductivity type as the substrate, preferably p-type. The drift region may be formed of a material having the same conductivity type as the source and drain regions, preferably n-type, although the relative doping concentration of the drift region compared to the source and drain regions is typically lower.

The exemplary LDMOS device 200 further includes a gate 218 formed above at least a portion of the channel region 216 and proximate the upper surface of the epitaxial layer 204. The gate may be formed of, for example, polysilicon material, although alternative suitable materials (e.g., metal) may be similarly employed. A conductive structure 220, which may be referred to herein as a dummy gate, is formed in the LDMOS device 200 between the gate 218 and the drain region 208. The dummy gate 220 is preferably formed in close relative proximity (e.g., 200 nanometers (nm)) to the upper surface of the epitaxial layer 204, above at least a portion of the drift region 212, 214 of the LDMOS device. The dummy gate 220 is electrically isolated from the gate 218. As previously stated, the dummy gate 220 reduces the Miller capacitance Cgd between the gate and drain of the LDMOS device, thereby improving the high-frequency performance of the device, and reduces HCI degradation in the device.

The dummy gate 220 in the exemplary LDMOS device is electrically connected (i.e., strapped) to the source region 206 using, for example, one or more conductive traces, contact vias and/or conductive plugs 234. The conductive trace and contact vias may be formed using a high level metalization process (e.g., second or higher level metal), while the conductive plug, which provides an electrical connection between the source region 206 and one of the contact vias, may be formed during the same process step used to form the dummy gate 220. The electrical connection between the dummy gate 220 and the source region 206 is preferably spaced far enough from the gate 218 so that gate-to-source capacitance Cgs is not significantly increased. In a preferred embodiment of the invention, the electrical connection bridging the dummy gate 220 to the source region 206 is spaced about one micron from the gate 218. Alternative methods of forming the electrical connection between the dummy gate 220 and the source region 206 are similarly contemplated by the present invention.

The shape of the dummy gate 220 can substantially affect a distribution of equipotential lines, and thus an electric field, in the LDMOS device. By controlling the shape of the dummy gate 220, the electric field in at least the drift region of the LDMOS device can be more uniformly distributed so as to reduce HCI degradation, and thus increase the breakdown voltage, of the device. As shown in the figure, the dummy gate 220 preferably comprises a first end 230 formed proximate the upper surface of the epitaxial layer 204, above at least a portion of the drift region 212, 214, and spaced apart from the gate 218 (e.g., about 0.6 micrometers (μm)). The dummy gate 220 further comprises a second end 232 extending substantially laterally toward the drain region 208 above at least a portion of the drift region 212, 214. At least a portion of the dummy gate 220 may overlap the gate 218, as shown in the figure.

The dummy gate 220 is configured such that a thickness of the insulating layer 228 under the second end 232 of the dummy gate increases as the second end extends toward the drain region 208. In the exemplary LDMOS device 200, the dummy gate 220 is configured to have a single step, wherein a thickness of the insulating layer 228 under the second end 232 is greater compared to a thickness of the insulating layer under the first end 230. The thickness of the insulating layer 228 under the first end 230 of the dummy gate 220 may be substantially equal to a gate oxide thickness of gate 218.

It is to be understood that the present invention is not limited to a particular shape and/or size of the dummy gate. For example, while the dummy gate 220 shown in FIG. 2 is configured such that the second end 232 includes a single step, in an alternative embodiment of the invention (not shown), at least a portion of the second end of the dummy gate may include a plurality of steps. In the multiple-step dummy gate arrangement, a cross-sectional spacing between a given step and the upper surface of the epitaxial layer 204 (and thus a thickness of the insulating layer 228 under the second end) preferably increases as the second end of the dummy gate extends toward the drain region 208. Thus at least a portion of the second end of the dummy gate 220 may resemble a rising staircase as the dummy gate extends away from the gate 218 and toward the drain region 208.

Figure 3:
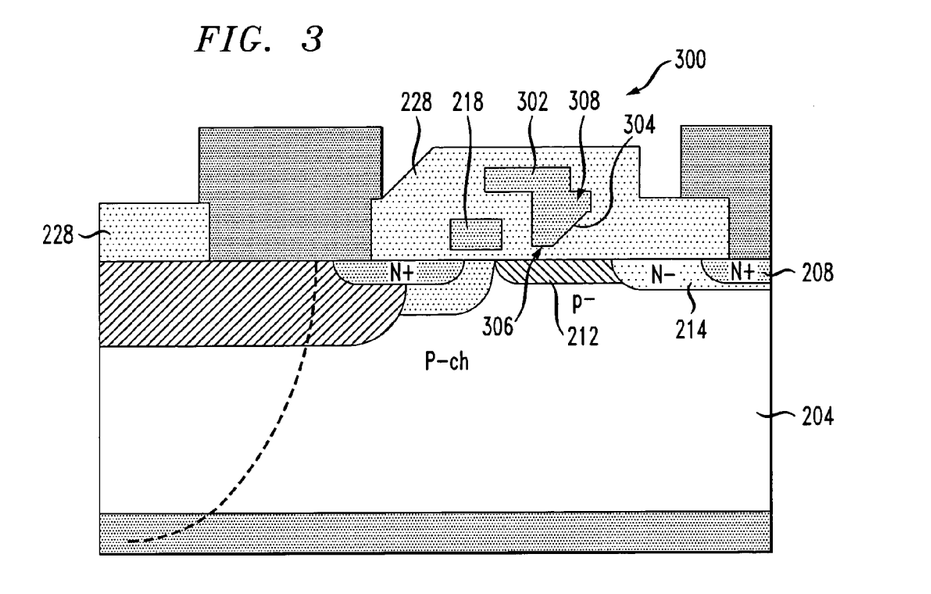
FIG. 3 is a cross-sectional view illustrating at least a portion of a semiconductor wafer including an exemplary LDMOS device, formed in accordance with another embodiment of the present invention.

FIG. 3 illustrates a cross-sectional view of at least a portion of a semiconductor wafer including an exemplary LDMOS device 300 formed in accordance with an alternative embodiment of the invention. LDMOS device 300 may be formed in a manner consistent with LDMOS device 200 depicted in FIG. 2, except for the configuration of the dummy gate. Specifically, like LDMOS device 200, LDMOS device 300 includes a dummy gate 302 comprising a first end 306 formed proximate an upper surface of epitaxial layer 204, above at least a portion of drift region 212, 214, and spaced apart from gate 218 (e.g., about 0.6 micrometers (μm)). A second end 308 of the dummy gate 302 extends laterally toward drain region 208 above at least a portion of the drift region 212, 214. At least a portion of the dummy gate 302 may overlap the gate 218, as shown in the figure, while the dummy gate remains electrically isolated from the gate. The dummy gate 302 is preferably configured such that at least a portion of the second end 308 comprises a sloped portion 304. The sloped portion 304 preferably rises upward (in relation to the orientation shown in FIG. 3) substantially linearly in relation to the upper surface of the epitaxial layer 204, such that a thickness of insulating layer 228 under the second end of the dummy gate 302 increases as the second end of the dummy gate extends laterally above the drift region 212, 214 toward the drain region 208. It is to be appreciated that the sloped portion 304 of the dummy gate 302 need not be linear and may, in fact, be at least partially non-linear (e.g., curved).

Figure 4:
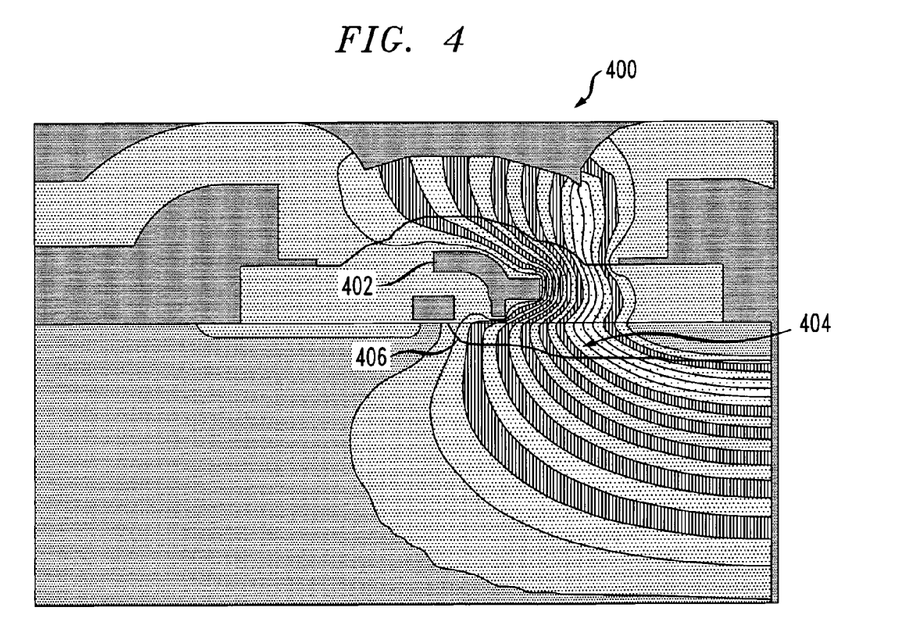
FIG. 4 is a cross-sectional view depicting equipotential lines which may exist in an exemplary LDMOS device formed in accordance with the present invention.

In order to demonstrate a beneficial characteristic of the techniques of the present invention described herein, FIG. 4 illustrates a cross-sectional view depicting simulated equipotential lines which may exist in an exemplary LDMOS device 400 formed in accordance with the invention. The LDMOS device 400 includes a dummy gate 402 having a stepped configuration, similar to LDMOS device 200 shown in FIG. 2. As apparent from the figure, equipotential lines 404 in at least a drift region 406 of the device are more uniformly distributed as compared to in a conventional LDMOS device. Because the electric field distribution in the drift region is also more uniformly distributed, the techniques of the present invention advantageously enable the LDMOS device to achieve an increased breakdown voltage compared to conventional LDMOS devices for a same doping level of the drift region. Moreover, a doping concentration of the drift region can be beneficially increased without significantly reducing breakdown voltage in the LDMOS device, thereby enabling the device to achieve a reduced drain-to-source resistance for a given breakdown voltage compared to conventional LDMOS devices.

FIGS. 5A–5D depict steps in an illustrative methodology which may be used in forming the exemplary LDMOS device 200 shown in FIG. 2, in accordance with one aspect of the present invention. The illustrative methodology will be described in the context of a conventional CMOS compatible semiconductor fabrication process technology. It is to be understood, however, that the invention is not limited to this or any particular methodology for fabricating the device.

Figure 5A:
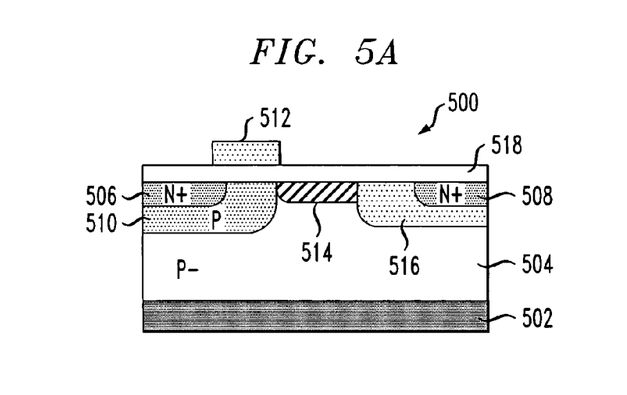
FIGS. 5A–5D are cross-sectional views depicting steps in a semiconductor fabrication process which may be used in forming an LDMOS device of the type shown in FIG. 2.

FIG. 5A depicts a cross section of at least a portion of an exemplary semiconductor wafer 500 in which the techniques of the present invention are implemented. The wafer 500 includes an LDMOS device formed on a substrate 502. The substrate 502 is preferably a p+ type substrate having a high conductivity, although an n+ type substrate may alternatively be employed. As will be understood by those skilled in the art, a p+ substrate may be formed by adding a p-type impurity or dopant (e.g., Boron) of a desired concentration (e.g., about $5 \times 10^{18}$ to about $5 \times 10^{19}$ atoms per cubic centimeter) to the substrate material, such as by a diffusion or implant step, to change the conductivity of the material as desired. An epitaxial layer 504 is then grown over the entire surface of the wafer. The epitaxial layer 504 may also be modified by adding a p-type impurity. A breakdown voltage of the resulting transistor structure is determined, at least in part, by the thickness and impurity concentration of the epitaxial layer 504. Connections, for example, via one or more sinkers (not shown) between an upper surface of the wafer 500 and the p+ substrate 502 are preferably formed through epitaxial layer 504, followed by an oxide formation (e.g., oxidation) step.

The LDMOS device may be formed on the substrate 502 in a conventional manner, having a source region 506, a gate 512 and a drain region 508. A channel region 510 is formed in the epitaxial layer 504 proximate the source region 506 and at least partially under the gate 512. In a preferred embodiment, the channel region 510 may be formed, for example, by diffusing or implanting a p-type impurity of a known concentration level into the channel region.

A first LDD region 514 and a second LDD region 516 are preferably formed in the epitaxial layer 504 such as, for example, by using a diffusion or implant step. During the formation of the first and second LDD regions 514 and 516, respectively, an n-type impurity (e.g., arsenic or phosphorous) of a predetermined concentration level is preferably employed. The LDD regions 514, 516 will form at least a portion of a drift region in the resulting LDMOS device. The doping concentrations of the LDD regions 514, 516 need not be the same and are preferably less than the doping concentration of the drain region 508. The source region 506 is formed in at least a portion of a p-type enhancement region (not shown) and the drain region 508 is formed in at least a portion of the second LDD region 516. The source and drain regions 506, 508 may be formed, for example, by diffusing or implanting an n-type impurity of a known concentration level into the respective enhancement and second LDD regions of the device. An interlayer deposition step (not shown) may also be performed (e.g., oxide and/or borophosphosilicate glass (BPSG) deposition).

A thin oxide layer 518 is formed on the epitaxial layer 504. The thin oxide layer 518 may comprise an insulating material, such as, for example, silicon dioxide, that is grown or deposited on the upper surface of the wafer 500 to a desired thickness (e.g., about 300–400 angstroms). The gate 512 may be fabricated from a polycrystalline silicon (polysilicon) layer formed over the thin oxide layer 518, such as, for example, using a chemical vapor deposition (CVD) technique. The thin oxide layer 518 under the gate 512 is often referred to as gate oxide. The polysilicon layer is generally patterned using, for example, a conventional photolithographic process, and followed by an etching step (e.g., dry etching) to define the gate 512 dimensions, as will be understood by those skilled in the art.

Figure 5B:
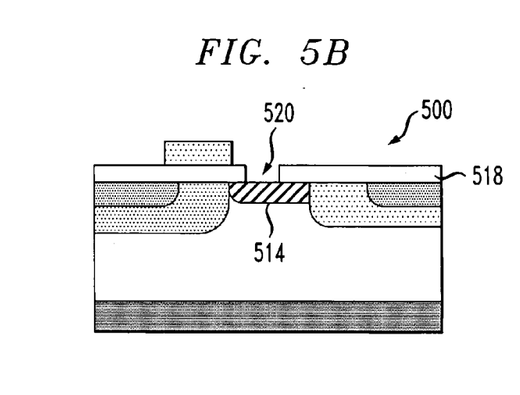
Figure 5C:
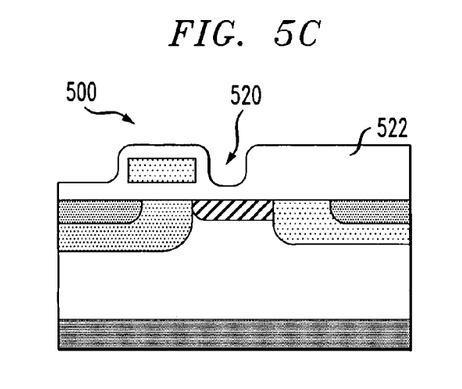

In FIG. 5B, an opening 520 is formed through the thin oxide layer 518 to expose at least a portion of the first LDD region 514. The opening 520 may be formed by conventional photolithographic patterning and etching. An oxide layer 522 is then formed on the upper surface of the wafer 500 to a desired thickness (e.g., about 300–1000 angstroms), as shown in FIG. 5C. Oxide layer 522 may comprise an insulating material such as, but not limited to, silicon dioxide. The oxide layer 522 may be formed of a desired thickness (e.g., 400 nm), for example, using a conventional oxidation or deposition process. A thickness of oxide layer 522 may be larger than (e.g., more than twice) the gate oxide thickness under gate 512, although the invention is not limited to any particular thickness of oxide layer 522.

Figure 5D:
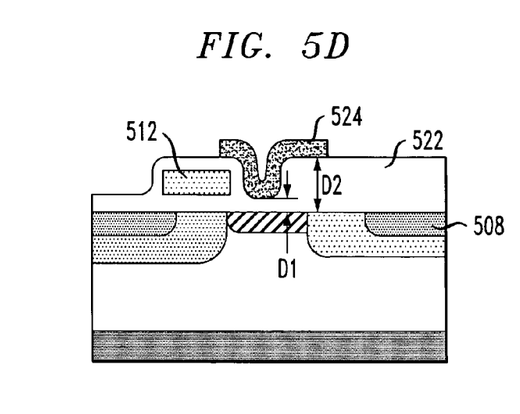

FIG. 5D illustrates the formation of a dummy gate 524 on at least a portion of oxide layer 522. Like the gate 512, dummy gate 524 may be fabricated from a polysilicon layer formed on the oxide layer 522, such as, for example, using a chemical vapor deposition (CVD) technique. It is to be appreciated that alternative materials for forming the dummy gate 524 may also be employed (e.g., metal). The dummy gate 524 may be defined using, for example, a conventional patterning and etching process. Dummy gate 524 preferably partially overlaps the gate 512 and extends laterally toward the drain region 508 substantially following a contour of the oxide layer 522. The dummy gate 524 is configured such that a thickness D2 of the oxide layer 522 under a portion of the dummy gate 524 extending toward the drain region 508 is greater relative to a thickness D1 of the oxide layer under a portion of the dummy gate proximate the gate 512.

FIGS. 6A–6G depict steps in an illustrative methodology which may be used in forming a sloped dummy gate LDMOS device similar to the exemplary LDMOS device 300 shown in FIG. 3, in accordance with another aspect of the invention. The illustrative methodology will be described in the context of a conventional CMOS compatible semiconductor fabrication process technology. Like the exemplary methodology shown in FIGS. 5A–5D, it is to be understood that the present invention is not limited to this or any particular methodology for fabricating the device.

Figure 6A:
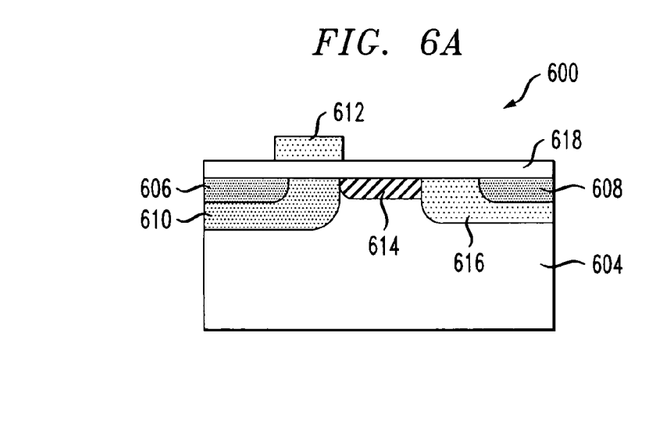
FIGS. 6A–6G are cross-sectional views depicting steps in a semiconductor fabrication process which may be used in forming an LDMOS device of the type shown in FIG. 3.
Figure 6B:
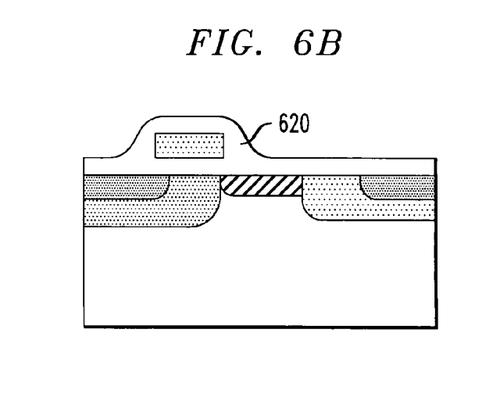

FIG. 6A depicts a cross section of at least a portion of a semiconductor wafer 600 in which the techniques of the present invention are implemented. In the figure, a gate definition process for forming a gate 612 of the exemplary LDMOS device is shown. Here, it is assumed that source region 606, drain region 608, channel region 610, first LDD region 614, second LDD region 616, thin oxide layer 618 and gate 612 are formed in and/or on an epitaxial layer 604 of the wafer 600 in a conventional manner, such as, for example, in accordance with the methodology previously described in conjunction with FIG. 5A. After the gate 612 is defined (e.g., using a photolithographic patterning and etching process), an oxide layer 620 is formed over at least a portion of the wafer 600, as shown in FIG. 6B, such as by using an oxidation or deposition step, as will be understood by those skilled in the art.

Figure 6C:
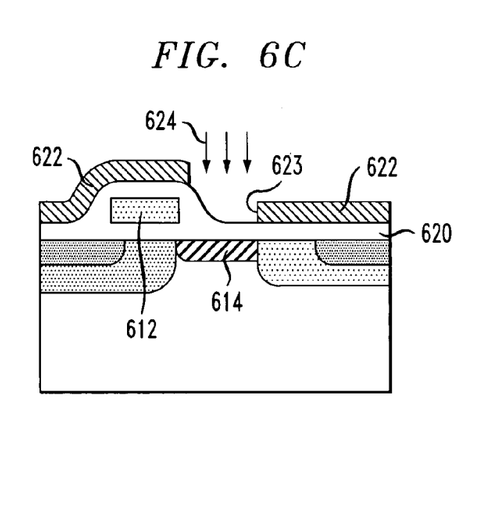
Figure 6D:
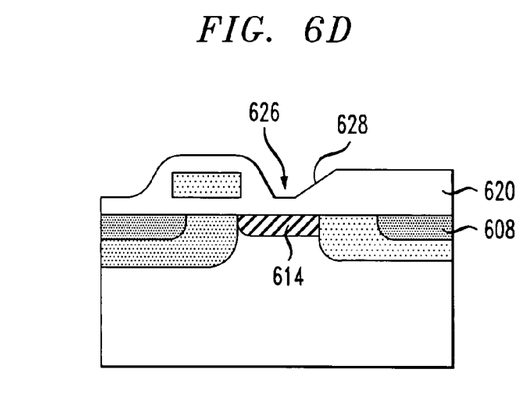

FIG. 6C illustrates the formation of a photoresist mask layer 622 on selected areas of the oxide layer 620, such as, for example, by using a photolithographic patterning and etching process, as will be known by those skilled in the art. The mask layer 622 is preferably configured having an opening 623 therein exposing a portion of the oxide layer 620 above at least a portion of the first LDD region 614 and proximate the gate 612. An impurity (e.g., argon) is subsequently driven into the exposed portion of oxide layer 620, such as by using a high energy ion implant step. The photoresist layer 620 is preferably used to prevent selected areas of the wafer from receiving the impurity implant. The argon implant step, in conjunction with an etching process (e.g., wet etching, reactive ion etching (RIE), etc.) can be used to form a trench 626 in the oxide layer 620, as shown in FIG. 6D. At least one sidewall 628 of the trench 626 is preferably substantially linearly sloped in a positive direction, such that a cross-sectional thickness of the oxide layer 620 increases from the first LDD region 614 toward the drain region 608. The trench 626 may be referred to as a v-groove, since the sidewalls are formed having a substantially v-shaped surface.

Figures 6E, 6F, 6G:
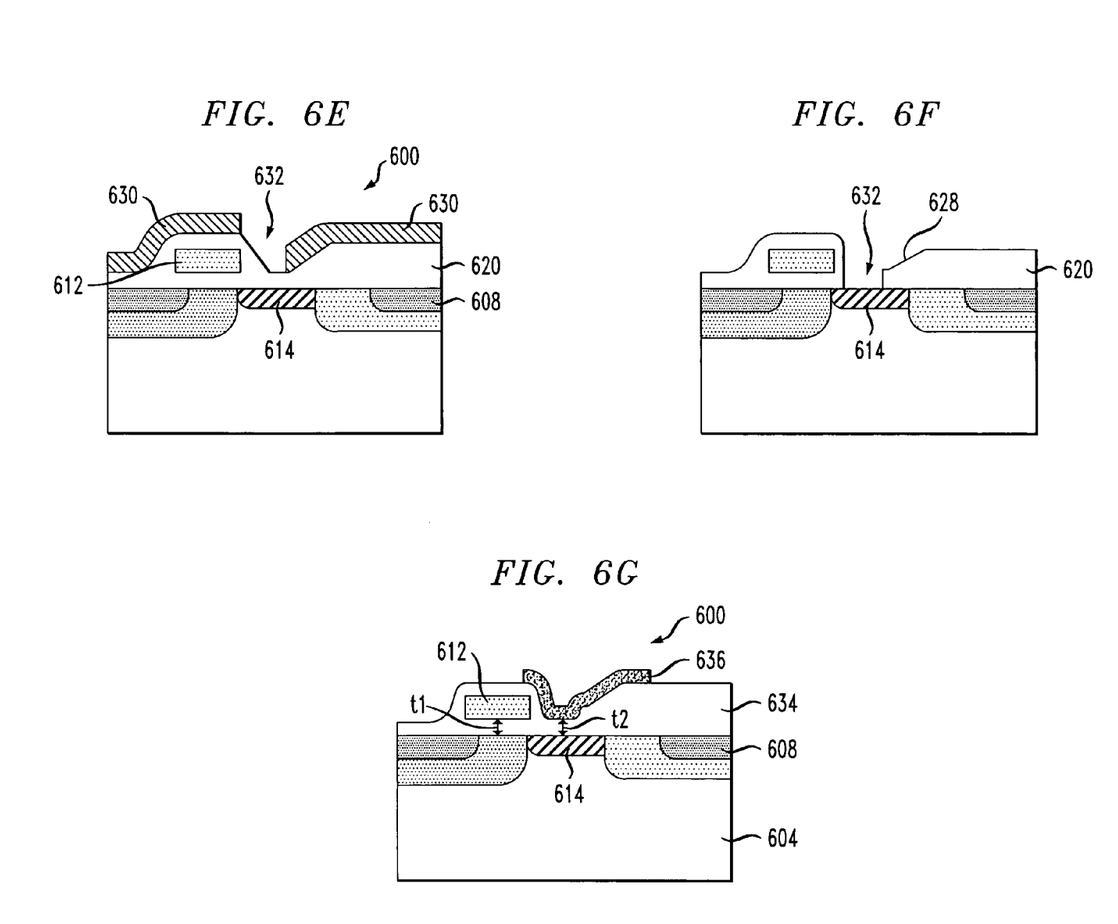

FIG. 6E illustrates the formation of a photoresist mask layer 630 on selected areas of the oxide layer 620, such as by using a photolithographic patterning and etching process. The mask layer 630 is preferably formed having at least one opening 632 therein exposing a portion of the oxide layer 620 proximate the gate 612 and above at least a portion of the first LDD region 614. The mask layer 630 preferably extends beyond an edge of the gate 612 facing the drain region 608. The exposed portion of the oxide layer 620 in opening 632 is then etched (e.g., using wet etching, dry etching, RIE, etc.) to expose at least a portion of the first LDD region 614, as shown in FIG. 6F. The photoresist mask layer 630 is then removed, for example, using an etching process. At least one of the sidewalls in opening 632 includes a sloped portion 628, as previously described in conjunction with FIG. 6D.

FIG. 6G illustrates the formation of an oxide layer 634 on at least a portion of the wafer 600, particularly in opening 632. It is to be appreciated that oxide layer 634 may comprise oxide layer 620, shown in FIG. 6F, and additional oxide material so as to form a new oxide layer that is thicker in comparison to oxide layer 620. The oxide layer 634 is preferably formed to a desired thickness t2 using, for example, an oxide growth or an oxide deposition process. The thickness t2 of the oxide layer 634 need not be equal to the gate oxide thickness t1, but may instead be selected so as to minimize capacitance or otherwise improve a high-frequency performance of the device. A dummy gate 636 is subsequently formed on at least a portion of oxide layer 634. Like the gate 612, dummy gate 636 may be fabricated from a polysilicon layer formed on the oxide layer 634, such as, for example, using a CVD technique. Alternative materials (e.g., metal) and/or processes (e.g., sputtering) for forming the dummy gate 636 may also be employed, as will be understood by those skilled in the art.

The dummy gate 636 may be defined using, for example, a patterning and etching process. Dummy gate 636 preferably partially overlaps gate 612 and extends laterally toward the drain region 608 substantially following a contour of the oxide layer 634. The dummy gate 636 is thus configured such that at least a portion of the dummy gate extending toward the drain region 608 is sloped, with a spacing of the dummy gate relative to the upper surface of the epitaxial layer 604 increasing. In a preferred embodiment, the spacing of the dummy gate relative to the upper surface of the epitaxial layer 604 increases substantially linearly, as shown. It is to be understood that alternative configurations for the dummy gate are similarly contemplated by the present invention (e.g., curved contour, etc.).

Figure 7:
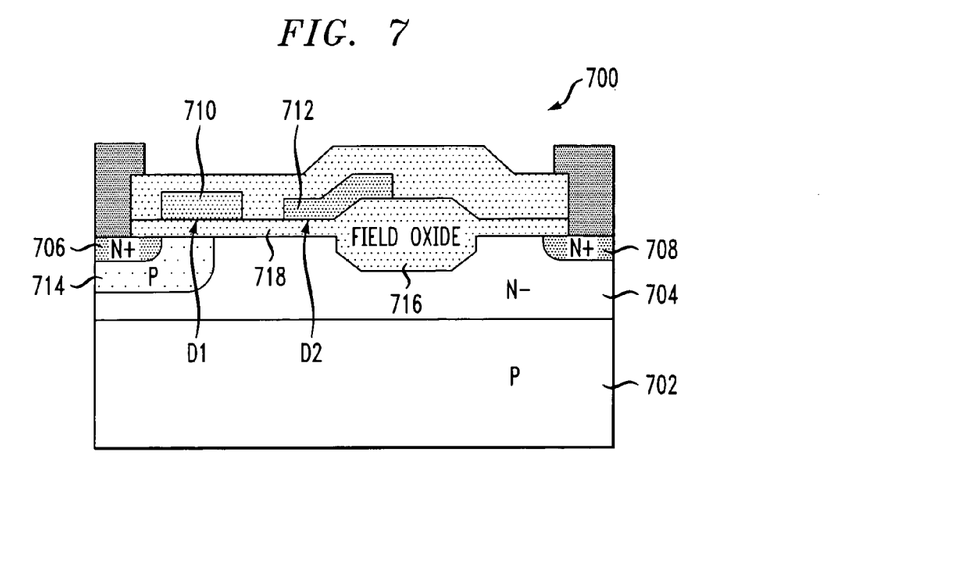
FIG. 7 is a cross-sectional view illustrating at least a portion of a semiconductor wafer including an exemplary LDMOS device, formed in accordance with the present invention.

FIG. 7 depicts a cross-sectional view of at least a portion of a semiconductor wafer including an exemplary LDMOS device 700 formed in accordance with another embodiment of the invention. The LDMOS device 700 preferably comprises an n-type epitaxial layer 704 formed on a p-type substrate 702. Source and drain regions 706 and 708, respectively, are formed in the epitaxial layer 704 in a conventional manner, such as, for example, using an implant or a diffusion process. The source and drain regions are preferably doped with an n-type impurity (e.g., arsenic or phosphorous) of a known concentration level. A gate 710 is formed proximate an upper surface of the epitaxial layer 704 and between the source and drain regions 706 and 708, respectively. The gate 710 is formed above at least a portion of a channel region 714 formed in the epitaxial layer 704 of the device between the source and drain regions 706, 708. A dummy gate 712 is formed proximate the upper surface of the epitaxial layer 704 and spaced apart from the gate 710 (e.g., about 0.6 μm). The dummy gate 712 preferably extends laterally away from the gate 710 toward the drain region 708. Dummy gate 712 is preferably connected to the source region 706, such as, for example, using an electrically conductive trace (not shown) or alternative connection means.

A thick oxide layer, referred to herein as a field oxide layer 716, is preferably formed in and/or on the epitaxial layer 704 under at least a portion of the dummy gate 712 and at least partially between the channel region 714 and the drain region 708. The field oxide layer 716 preferably comprises an oxide, such as, for example, silicon dioxide, although alternative insulating materials may be similarly employed (e.g., silicon nitride, etc.). A cross-sectional thickness of field oxide layer 716 is substantially greater compared to a thickness of a thin oxide layer 718 formed at least under the gate 710 and above the source and drain regions 706, 708. The formation of field oxide layer 716 provides electrical isolation between the channel region 714 and the drain region 708. The thin oxide layer 718 is preferably formed of the same material as is used to form the field oxide layer 716 (e.g., silicon dioxide), and can be formed, for example, using a local oxidation of silicon (LOCOS) process, as will be known by those skilled in the art. The thin oxide layer 718 under the gate 710 may be referred to as gate oxide.

The dummy gate 712 is preferably configured such that at least a portion of a first end is formed on the thin oxide layer 718 and at least a portion of a second end opposite the first end of the dummy gate is formed on the field oxide layer 716. By the forming the dummy gate partially on the field oxide layer 716, the thickness of the oxide layer under the dummy gate advantageously increases as the dummy gate extends laterally toward the drain region 708. It is to be appreciated that the thickness D1 of the gate oxide need not be the same as the thickness D2 of the thin oxide layer under the first end of the dummy gate 712. The dummy gate 712 may comprise polysilicon material, as may be used to form the gate 710. The gate 710 and dummy gate 712 can be formed in the same fabrication step, and thickness D1 may be substantially equal to thickness D2.

As previously stated, the formation of a field oxide layer 716 helps to electrically isolate the source and drain regions from one another. By forming the LDMOS device 700 in this manner, the doping concentration of at least a portion of the epitaxial layer 704 can be significantly increased, such as, for example, by about a factor of two in comparison to the doping level of a standard LDMOS device (e.g., about $2 \times 10^{12}$ to $4 \times 10^{12}$ atoms per square centimeter, compared to a typical doping concentration of about $1 \times 10^{12}$ to $2 \times 10^{12}$ atoms per square centimeter), without an appreciable increase in HCI degradation. In this manner, one or more conventional LDD regions may be omitted, with the epitaxial layer 704 replacing the function of the LDD regions. Since the epitaxial layer 704 is formed significantly deeper compared to the LDD regions, the current in the LDMOS device can be more easily distributed rather than being concentrated near the silicon/oxide interface, thus contributing to the reduction in HCI effects. Moreover, by increasing the doping concentration of the epitaxial layer, an on-resistance of the device, which is typically a function of the doping level of the LDD region and/or epitaxial layer, is also advantageously reduced. Thus, by forming an MOS device in accordance with the techniques of the present invention, a reduction in on-resistance and HCI effects can be concurrently achieved.

Figure 8:
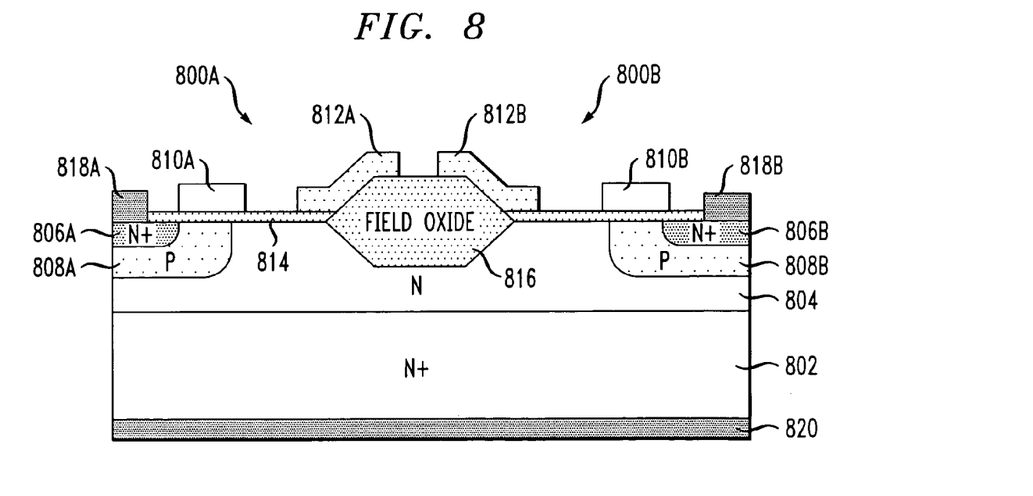
FIG. 8 is a cross-sectional view illustrating at least a portion of a semiconductor wafer including an exemplary vertical DMOS device in which the techniques of the present invention are implemented.

FIG. 8 illustrates a cross-sectional view of at least a portion of a semiconductor wafer including a pair of exemplary vertical diffused MOS (DMOS) devices 800A and 800B formed in accordance with another aspect of the present invention. The vertical DMOS devices 800A, 800B may comprise a common n-type epitaxial layer 804 formed on an n-type substrate 802, with a doping concentration of the substrate being greater than a doping concentration of the epitaxial layer. Source regions 806A and 806B corresponding to vertical DMOS devices 800A and 800B, respectively, are preferably formed in the epitaxial layer 804, proximate an upper surface of the epitaxial layer and spaced apart relative to one another. The source regions 806A, 806B are preferably doped with an n-type impurity (e.g., arsenic or phosphorous) of a known concentration level. Gates 810A and 810B corresponding to vertical DMOS devices 800A and 800B, respectively, are formed on an oxide layer 814, above at least a portion of respective channel regions 808A and 808B. The channel regions 808A, 808B are formed of p-type material in the epitaxial layer 804, proximate the upper surface of the epitaxial layer and at least partially under the respective source regions 806A, 806B.

The oxide layer 814 is formed on at least a portion of the upper surface of epitaxial layer 804 using, for example, a conventional oxide growth or deposition process, as will be known by those skilled in the art. Oxide layer 814 may comprise, for example, silicon dioxide, or an alternative insulating material (e.g., silicon nitride, etc.). The oxide layer 814 may be formed having thin oxide regions, such as the regions under the gates 810A and 810B, and may further include a field oxide region 816 formed between the two gates 810A, 810B. A LOCOS process may be used to form the thin oxide and field oxide regions. The field oxide region 816 is preferably formed between the two devices 800A, 800B and serves, at least in part, to electrically isolate the two vertical DMOS devices 800A, 800B from one another.

Each of the vertical DMOS devices 800A and 800B further includes a dummy gate 812A and 812B, respectively, which is preferably formed on the oxide layer 814 proximate the respective gates 810A, 810B. Dummy gates 812A and 812B are electrically connected to corresponding source regions 806A and 806B. The dummy gates 812A, 812B may be configured in a manner consistent with the methodology previously described in conjunction with FIG. 7, such that at least a portion of each dummy gate 812A, 812B is preferably formed on the thin oxide region of oxide layer 814 proximate respective gates 810A, 810B, with each dummy gate extending laterally over at least a portion of the field oxide region 816. In this manner, each of the dummy gates 812A, 812B can be configured as sloped conductive structures having a thickness of the oxide layer (e.g., 814, 816) beneath one end of a given dummy gate which increases as the dummy gate extends away from the corresponding gate 810A, 810B. Dummy gates 812A and 812B are preferably electrically isolated from one another.

The vertical DMOS devices 800A and 800B further include source contacts 818A and 818B, respectively, for providing electrical connection to the corresponding source regions 806A and 806B. The vertical DMOS devices 800A, 800B further include a common drain contact 820 for providing electrical connection to the substrate 802. In the vertical DMOS embodiment, the n-type substrate serves as a common drain region for devices 800A and 800B.

In accordance with another aspect of the invention, rather than forming the dummy gate as a single conductive structure, as shown in FIGS. 2–8, the dummy gate may comprise a plurality of separate conductive segments connected to one another and to the source region. By way of example only, an illustrative LDMOS comprising a dummy gate formed having a plurality of conductive segments is shown in FIG. 9.

Figure 9:
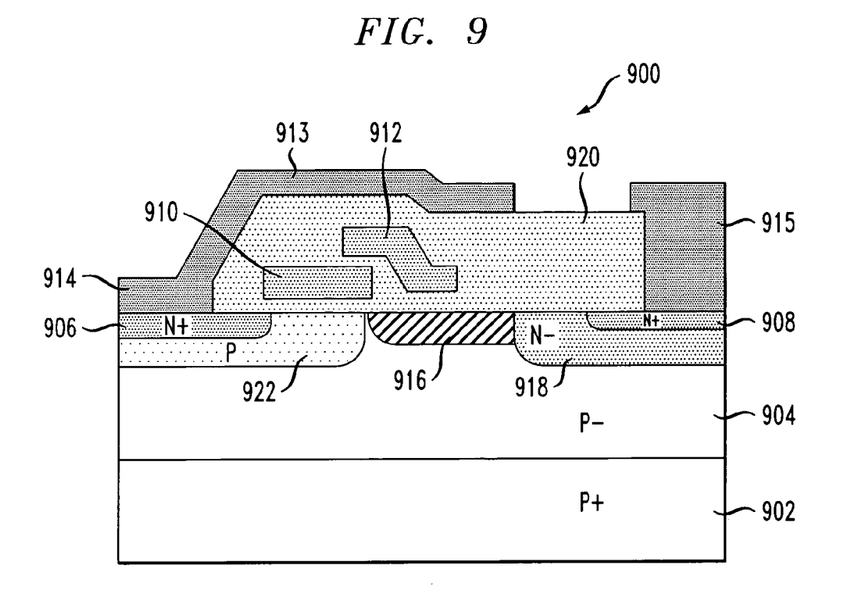
FIG. 9 is a cross-sectional view illustrating at least a portion of a semiconductor wafer including an exemplary LDMOS device, formed in accordance with the present invention.

FIG. 9 depicts a cross-sectional view of at least a portion of a semiconductor wafer including an exemplary LDMOS device 900 formed in accordance with another embodiment of the invention. The exemplary LDMOS device 900 preferably comprises a p-type epitaxial layer 904 formed on a p-type substrate 902. Source and drain regions 906 and 908, respectively, are formed in the epitaxial layer 904 proximate an upper surface of the epitaxial layer. The source and drain regions 906, 908 are preferably doped with an n-type impurity (e.g., arsenic or phosphorous) of a known concentration level and are spaced apart relative to one another. A gate 910 is formed on at least a portion of an oxide layer 920 and between the source and drain regions 906, 908. The oxide layer 920 is formed on at least a portion of the epitaxial layer 904. The gate 910 is formed above at least a portion of a p-type channel region 922 formed in the epitaxial layer 904 at least partially between the source and drain regions 906, 908. The LDMOS device 900 may comprise a drift region, including a first LDD region 916 and a second LDD region 918. The drift region is preferably formed in the epitaxial layer 904 proximate the upper surface of the epitaxial layer and extending at least partially between the channel region 922 and drain region 908. The exemplary LDMOS device 900 further includes source and drain contacts 914 and 915, respectively, for providing electrical connection to the respective source and drain regions 906, 908.

The exemplary LDMOS device 900 includes a dummy gate which is formed proximate the upper surface of the epitaxial layer 904 and spaced apart from the gate 910. The dummy gate in LDMOS device 900 is preferably comprised of a plurality of separate electrically conductive segments, connected to one another and to the source region 906, such as, for example, by an electrically conductive trace and/or vias (not all shown). Specifically, the dummy gate in LDMOS device 900 preferably comprises at least a first conductive segment 912 formed proximate the gate 910 above at least a portion of the drift region, and a second conductive segment 913 which overlaps at least a portion of the first conductive segment 912 and extends over at least a portion of the drift region, beyond the first conductive segment, toward the drain region 908. The conductive segments 912, 913 are preferably formed of an electrically conductive material, such as, but not limited to, polysilicon or a metal (e.g., aluminum, gold, etc.). As apparent from the figure, the second conductive segment 913 may be formed as an extension of the source contact 914, with the extended portion overlapping the gate 910 and first conductive segment 912. A spacing between the conductive segments 912, 913 forming the dummy gate and the upper surface of the epitaxial layer 904 increases as the conductive segments extend over at least a portion of the drift region (e.g., 916 and 918) toward the drain region 908.

Figure 10:
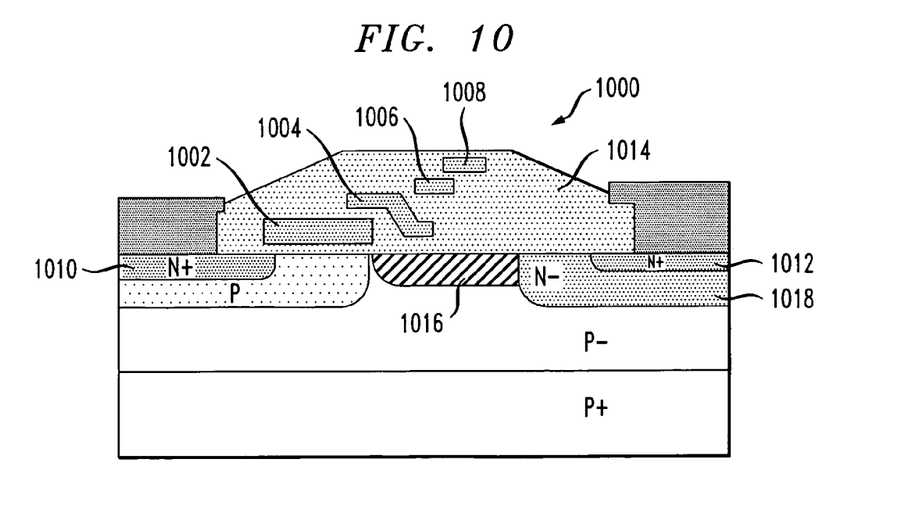
FIG. 10 is a cross-sectional view illustrating at least a portion of a semiconductor wafer including an exemplary LDMOS device, formed in accordance with the present invention.

FIG. 10 depicts another illustrative LDMOS device 1000 comprising a dummy gate including a plurality of conductive segments, formed in accordance with another embodiment of the invention. The LDMOS device 1000 may be formed in a manner consistent with the LDMOS 900 shown in FIG. 9. As apparent from FIG. 10, the dummy gate includes first, second and third conductive segments 1004, 1006 and 1008, respectively, which are connected to one another and to a source region 1010 of the exemplary LDMOS device 1000. The conductive segments forming the dummy gate may be connected to one another, for example, by a conductive trace and/or vias (not shown), as will be understood by those skilled in the art.

The dummy gate of the LDMOS device 1000 is preferably configured such that the first conductive segment 1004 at least partially overlaps an edge of gate 1002. The second conductive segment 1006 at least partially overlaps the first conductive segment 1004 and extends beyond the first conductive segment above at least a portion of a drift region (e.g., comprising first LDD region 1016 and second LDD region 1018), toward a drain region 1012 of the device. Likewise, the third conductive segment 1008 at least partially overlaps the second conductive segment 1006 and extends beyond the second conductive segment toward the drain region 1012. The conductive segments 1004, 1006, 1008 are preferably arranged such that a thickness of an oxide layer 1014 under each of the conductive segments preferably increases as the dummy gate segments collectively extend toward the drain region 1012. The dummy gate, when considered as a whole, including all of the separate conductive segments 1004, 1006, 1008, preferably functions as a stepped dummy gate, similar to the stepped dummy gate structure depicted in FIG. 2.

A plurality of identical die are typically formed in a repeated pattern on a surface of the wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A metal-oxide-semiconductor (MOS) device, comprising:
    a semiconductor layer of a first conductivity type;
    a source region of a second conductivity type formed in the semiconductor layer;
    a drain region of the second conductivity type formed in the semiconductor layer and spaced apart from the source region;
    a drift region formed in the semiconductor layer proximate an upper surface of the semiconductor layer and between the source and drain regions;
    an insulating layer formed on at least a portion of the upper surface of the semiconductor layer and above at least a portion of the drift region;
    a gate formed on the insulating layer and at least partially between the source and drain regions; and
    a conductive structure comprising a first end formed on the insulating layer and spaced apart from the gate, and a second end formed on the insulating layer and extending laterally toward the drain region, the first and second ends of the conductive structure formed above at least a portion of the drift region, at least a portion of the conductive structure being formed above the gate so as to overlap at least a portion of the gate;
    wherein the conductive structure is configured such that a distance between a lower surface of the first end of the conductive structure and an upper surface of the drift region is less than a distance between a lower surface of the second end of the conductive structure and the upper surface of the drift region.

2. The device of claim 1, wherein the conductive structure is configured such that a spacing between the first end of the conductive structure and the upper surface of the semiconductor layer is substantially less than a spacing between the second end of the conductive structure and the upper surface of the semiconductor layer.

3. The device of claim 1, wherein the conductive structure is configured such that a thickness of the conductive structure decreases as the second end extends toward the drain region.

4. The device of claim 1, wherein the conductive structure is connected to the source region by a conductive trace, the conductive trace being spaced substantially from the gate by a second portion of the insulating layer formed between the gate and the conductive trace.

5. The device of claim 4, wherein the conductive trace is formed using a metalization process.

6. The device of claim 4, wherein the conductive trace is formed using at least a second level metalization process.

7. The device of claim 1, wherein the insulating layer comprises an oxide.

8. The device of claim 1, wherein the device comprises a diffused MOS (DM0S) device.

9. The device of claim 1, wherein the device comprises a laterally diffused MOS (LDMOS) device.

10. The device of claim 1, wherein the device comprises a vertical diffused MOS device.

11. The device of claim 1, wherein the conductive structure is formed relative to the gate so as to reduce a capacitance between the gate and the drain region without substantially increasing a capacitance between the gate and the source region.

12. The device of claim 1, wherein at least a portion of the second end of the conductive structure comprises at least one step between the gate and the drain region, wherein a spacing between the second end of the conductive structure and the upper surface of the semiconductor layer increases in a direction from the first end toward the drain region as the second end of the conductive structure extends toward the drain region.

13. The device of claim 1, wherein the conductive structure is configured such that at least a portion of the second end comprises a plurality of steps between the gate and the drain region, wherein a spacing between the upper surface of the semiconductor layer and each successive step increases in a direction from the first end toward the drain region as the second end of the conductive structure extends toward the drain region.

14. The device of claim 1, wherein the conductive structure is configured such that at least a portion of the second end is sloped between the gate and the drain region, with a thickness of the insulating layer under the second end increasing as the second end extends toward the drain region.

15. The device of claim 14, wherein the slope of the second end of the conductive structure is substantially linear between the gate and drain region.

16. The device of claim 1, further comprising a conductive layer formed on an upper surface of the gate such that the conductive layer substantially covers the upper surface of the gate, whereby a resistance of the gate is reduced.

17. The device of claim 1, wherein the conductive structure comprises a plurality of conductive segments electrically connected to one another and to the source region.

18. The device of claim 1, wherein the conductive structure comprises at least first and second conductive segments, the at least first and second conductive segments being electrically connected to one another and to the source region, the second conductive segment extending further toward the drain region in relation to the first conductive segment, the second conductive segment at least partially overlapping the first conductive segment, the first and second conductive segments being configured such that a spacing between the second conductive segment and the upper surface of the semiconductor layer is greater than a spacing between the first conductive segment and the upper surface of the semiconductor layer.

19. The device of claim 18, wherein the first conductive segment comprises a gate shield and the second conductive segment comprises a source contact including a first end and a second end opposite the first end, the source contact being connected to the source region at the first end, the second end extending over the gate and the gate shield, the source contact being electrically isolated from the gate.

20. An integrated circuit including at least one metal-oxide-semiconductor (MOS) device, the at least one MOS device comprising:
   a semiconductor layer of a first conductivity type;
   a source region of a second conductivity type formed in the semiconductor layer;
   a drain region of the second conductivity type formed in the semiconductor layer and spaced apart from the source region;
   a drift region formed in the semiconductor layer proximate an upper surface of the semiconductor layer and between the source and drain regions;
   an insulating layer formed on at least a portion of the upper surface of the semiconductor layer and above at least a portion of the drift region;
   a gate formed on the insulating layer and at least partially between the source and drain regions; and
   a conductive structure comprising a first end formed on the insulating layer and spaced apart from the gate, and a second end formed on the insulating layer and extending laterally toward the drain region, the first and second ends of the conductive structure formed above at least a portion of the drift region, at least a portion of the conductive structure being formed above the gate so as to overlap at least a portion of the gate;
   wherein the conductive structure is configured such that a distance between a lower surface of the first end of the conductive structure and an upper surface of the drift region is less than a distance between a lower surface of the second end of the conductive structure and the upper surface of the drift region.

21. The integrated circuit of claim 20, wherein at least a portion of the second end of the conductive structure in the at least one MOS device comprises at least one step between the gate and the drain region, wherein a spacing between the second end of the conductive structure and the upper surface of the semiconductor layer increases as the second end of the conductive structure extends toward the drain region.

22. The integrated circuit of claim 20, wherein the conductive structure in the at least one MOS device is configured such that at least a portion of the second end comprises a plurality of steps between the gate and the drain region, wherein a spacing between the upper surface of the semiconductor layer and each successive step increases as the second end of the conductive structure extends toward the drain region.

23. The integrated circuit of claim 20, wherein the conductive structure in the at least one MOS device is configured such that at least a portion of the second end is sloped between the gate and the drain region, with a thickness of the insulating layer under the second end increasing as the second end extends toward the drain region.

24. The integrated circuit of claim 20, wherein the conductive structure in the at least one MOS device comprises at least first and second conductive segments, the at least first and second conductive segments being electrically connected to one another and to the source region, the second conductive segment extending further toward the drain region in relation to the first conductive segment, the second conductive segment at least partially overlapping the first conductive segment, the first and second conductive segments being configured such that a spacing between the second conductive segment and the upper surface of the semiconductor layer is greater than a spacing between the first conductive segment and the upper surface of the semiconductor layer.

25. A method of forming a metal-oxide-semiconductor device, the method comprising the steps of:
   forming source and drain regions of a first conductivity type in a semiconductor layer of a second conductivity type, the source and drain regions being formed proximate an upper surface of the semiconductor layer and spaced apart relative to one another;
   forming a drift region of the first conductivity type between the source and drain regions and proximate the upper surface of the semiconductor layer;
   forming an insulating layer on at least a portion of the upper surface of the semiconductor layer and above at least a portion of the drift region;
   forming a gate on at least a portion of the insulating layer and at least partially between the source and drain regions; and
   forming a conductive structure comprising a first end and a second end, the first end being formed on at least a portion of the insulating layer and spaced apart from the gate, the second end being formed on at least a portion of the insulating layer and extending laterally toward the drain region, the first and second ends of the conductive structure formed above at least a portion of the drift region, at least a portion of the conductive structure being formed above the gate so as to overlap at least a portion of the gate;
   wherein the conductive structure is formed such that a distance between a lower surface of the first end of the conductive structure and an upper surface of the drift region is less than a distance between a lower surface of the second end of the conductive structure and the upper surface of the drift region.

* * * * *